United States Patent
Webb et al.

(10) Patent No.: US 6,291,318 B1
(45) Date of Patent: Sep. 18, 2001

(54) GROWTH OF GAN ON SAPPHIRE WITH MSE GROWN BUFFER LAYER

(75) Inventors: James Webb, Manotick; Haipeng Tang, Ottawa, both of (CA)

(73) Assignee: National Research Council of Canada, Ottawa (CA)

(*) Notice: Subject to any disclaimer, the term of this patent is extended or adjusted under 35 U.S.C. 154(b) by 0 days.

(21) Appl. No.: 09/412,395

(22) Filed: Oct. 5, 1999

(51) Int. Cl.[7] .................................................. H01L 21/76
(52) U.S. Cl. ........................................................... 438/479
(58) Field of Search .................................... 438/478, 479, 438/509, 796, 913, 938, 967

(56) References Cited

PUBLICATIONS

Singh, P. et al., "Growth and characterization of GaN thin films by magnetron sputter epitaxy", J. Vac. Sci. Technol. A 16(2), pp. 786–789, May 1998.*

* cited by examiner

*Primary Examiner*—Keith Christianson
(74) *Attorney, Agent, or Firm*—Marks & Clerk

(57) ABSTRACT

A method of fabricating a gallium nitride or like epilayer on sapphire is disclosed wherein a buffer layer is grown on the sapphire substrate by magnetron sputter epitaxy (MSE); and then the gallium nitride epilayer is formed on the buffer layer, preferably by molecular beam epitaxy.

5 Claims, 2 Drawing Sheets

GROWTH OF GAN ON SAPPHIRE WITH MSE GROWN BUFFER LAYER

FIELD OF THE INVENTION

This invention relates to the growth of gallium nitride and like materials on a sapphire substrate.

BACKGROUND OF THE INVENTION

In recent years there has been tremendous interest in GaN based III-N materials. A dramatic improvement in the material quality has led to the development of high brightness light emitting diodes, and more recently "blue" laser diodes. There has also been a dramatic improvement in the performance of high power microwave metal-semiconductor field-effect transistors and modulation doped field-effect transistors based on these materials.

Crucial to all these applications is the growth of material with high crystalline quality and of high purity. Various techniques have been used to grow GaN including metalorganic vapor phase epitaxy (MOVPE), plasma molecular beam epitaxy (plasma MBE), ammonia molecular beam epitaxy (ammonia-MBE), also referred to as reactive molecular beam epitaxy, and magnetron sputter epitaxy (MSE). Typically GaN epilayers are grown on sapphire substrates, which are highly lattice mismatched, necessitating the predeposition of a thin (~500 Å) buffer/nucleation layer of either GaN or AlN. The observed electrical and optical properties of the resulting GaN layers is strongly dependent on the dislocation density and of the overall impurity content.

Using these growth techniques, room temperature electron mobilities for MOVPE-grown silicon doped GaN layers are typically reported in the range of 350–600 $cm^2/V$ s. The highest room temperature mobility ever reported for GaN was 900 $cm^2/V$ s deposited by MOVPE for a 4 $\mu$m thick layer. In contrast, the highest room temperature mobility for plasma-MBE grown GaN is around 300 $cm^2/V$ s and for ammonia-MBE is 350 $cm^2/V$ s.

SUMMARY OF THE INVENTION

According to the present invention there is provided a method of fabricating a gallium nitride or like epilayer on sapphire, comprising the steps of providing a sapphire substrate, growing a nucleation buffer layer on said sapphire substrate by magnetron sputter epitaxy (MSE) and subsequently forming said gallium nitride epilayer on said buffer layer.

Using this method, silicon doped GaN epilayers having room temperature electron mobilities>550 $cm^2/V$ s can be grown on grown on (0001)sapphire. Unlike other growth techniques, the initial buffer/nucleation layer, preferably of AlN (aluminum nitride), is grown by MSE.

The deposition of the GaN layers may be performed in a dual mode MBE/MSE system. The MSE technique differs from conventional MBE in that an ultrahigh vacuum dc magnetron sputter cathode is used as the group III source and deposition of the layers occurs in the pressure range of 1–5 mTorr.

Typically, the MSE technique is employed only for the growth of the buffer/nucleation layer. The GaN layer is deposited by ammonia MBE where a conventional dual filament K cell is used for the gallium source, and high purity ammonia is used as the source of nitrogen.

Preferably, the deposition system is equipped with a substrate holder capable of heating the 2 in. sapphire(0001) wafers to temperatures in excess of 1000° C. Typical growth temperatures for the GaN layers were in the range of 860–920° C. as measured by an optical pyrometer (emissivity set to 0.3).

BRIEF DESCRIPTION OF THE DRAWINGS

The invention will now be described in more detail, by way of example only, with reference to the accompanying drawings, in which.

DESCRIPTION OF THE PREFERRED EMBODIMENTS

Figure 1:
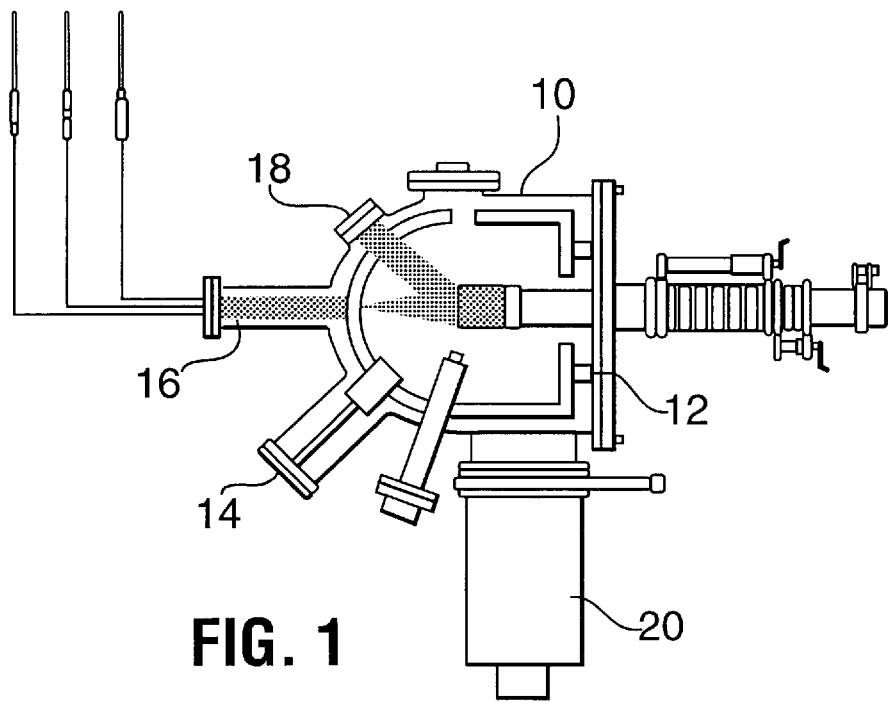
FIG. 1 is a schematic diagram of an MSE system.

The dual MBE (molecular beam epitaxy)/MSE system shown in FIG. 1 comprises a vacuum chamber 10 with a nitrogen cryoshroud 12, and port(s) 14 for K-cells, port 16 for a 3-source alkyl/gas injection cell, and port(s) 18 for modified-UHV magnetron sputter sources, such as aluminum. Cryopump 20 is connected to the chamber 10.

The main chamber 10 is cryo/turbopumped to a base pressure of $<5\times10^{-11}$ torr. Substrates up to 4" diameter are introduced into the main chamber via a load-lock and transfer arm. A BN coated graphite heater is used to heat substrates up to 1200° C. Substrates are typically 2" (0001) sapphire coated on the back surface with molybdenum. Smaller pieces are mounted using indium solder to a 2" silicon wafer.

With this system, a solid MBE-grade aluminum source can be D.C. sputtered using an argon plasma operating at 1~3 mtorr [target power of 50 Watts, 400 Volts]. High purity ammonia introduced via the gas injection cell is used as the nitrogen source [flow of 15 sccm]. The magnetron plasma is sufficient to provide a source of nitrogen ions for the growth of AlN. Growth rates for the MSE grown AlN buffer layer at 880° are typically 0.15 to 0.25 $\mu$m/hr.

EXAMPLE

Sapphire wafers (backside sputter coated with Mo) were degreased in chloroform vapor followed by a 1 min dip in 10% HF, then rinsed in deionized water and blown dry with nitrogen Gas. The substrate was then introduced into the system load-lock where degassing of the wafer was carried out before introduction into the growth chamber 10. The growth chamber was fully cryoshrouded with a base pressure of <10–9 Torr. The substrate was then heated to a temperature of 1000° C. under 130 sccm of ammonia for 10 min before cooling to the buffer layer growth temperature of 880° C.

The buffer or nucleation layer of AlN was used. This layer was deposited by MSE using a high purity Al magnetron sputter cathode and ammonia. The growth of the nucleation and epilayer was monitored using in situ laser reflectance spectrometry. A 200 A nucleation layer was deposited at a growth rate of 34 A/min with argon and ammonia flows of 40 and 15 sccm, respectively. This resulted in a deposition pressure of about 1.4 mTorr.

Following the deposition of the AlN nucleation layer, the substrate was then heated to the GaN epilayer growth temperature. The Ga K-cell temperature was adjusted to give a growth rate of from 1–2 μm/h at an ammonia flow rate of 50 sccm. Typical base pressures of $3\times10^{-6}$ Torr were observed during growth. Both undoped and silicon doped layers were grown. For the doped layers, silane was used as the dopant source. The formed GaN layers had thicknesses of ~2 μm.

The epilayers were characterized using a triple axis x-ray diffractometer ω and ω–2θ scans were carried out to determine both the mosaicity and crystalline quality of the deposited layers. Hall effect mobilities and carrier densities were measured using a van der Pauw geometry (sample size of ~0.5×0.5 cm, applied field of 3 kG) with soldered indium dots as the ohmic contacts. The contacts were verified to be ohmic by I–V measurements. Photoluminescence (PL) was performed at room temperature (RT) and 4 K using excitation from a He—Cd laser with an incident power density of <0.25 W/cm2.

Table 1 gives the observed x-ray linewidths and electrical data for a number of layers grown at several different temperatures. All data shown in Table I are for layers that were intentionally doped to $1–7\times10^{17} cm^{-3}$. As shown in Table 1, the minimum linewidths for the ω and ω–2θ scans were 210 and 13.7 arcsec, respectively, with the highest observed mobility of 560 $cm^2/V$ s for a carrier density of $1.44\times10^{17} cm^{-3}$.

TABLE 1

| Layer No. | X-ray ω scan (arcsec) | X-ray ω 2θ scan (arcsec) | Carrier density $\eta$ (× $10^{17}$ $cm^{-3}$) | Electron mobility $\mu$ ($cm^2$/Vs) |
|---|---|---|---|---|
| 1 | 210 | 13.7 | X.5 | 356 |
| 2 | 271 | 17.0 | 7.0 | 400 |
| 3 | 299 | 14.8 | 7.0 | 340 |
| 4 | 377 | 15.8 | 3.5 | 407 |
| 5 | 303 | 14.2 | 1.4 | 560 |
| 6 | 324 | 14.5 | 1.6 | 547 |
| 7 | 323 | 14.9 | 1.3 | 544 |

Figure 2:
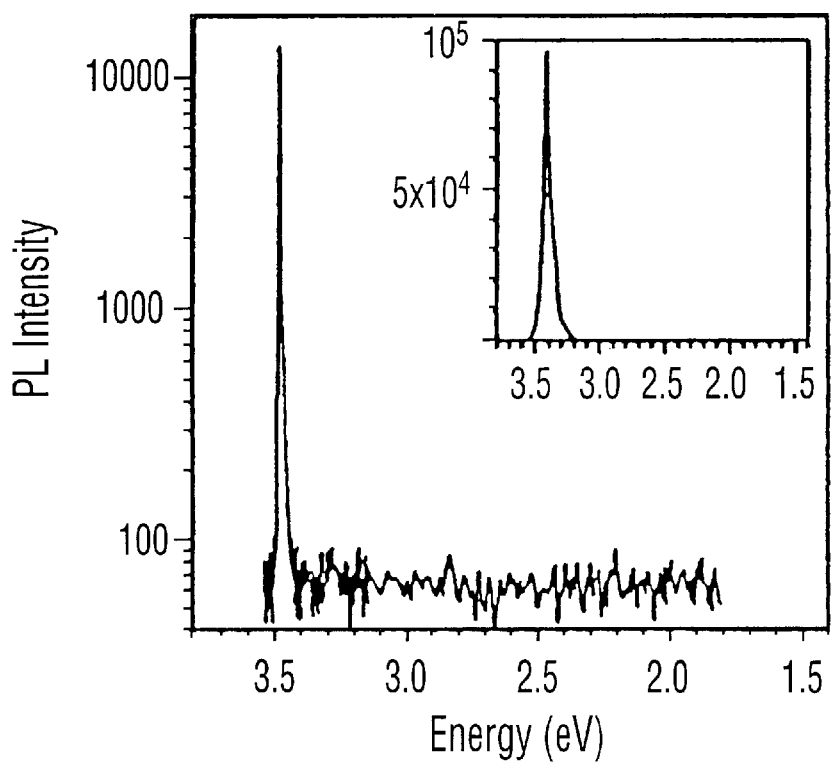
FIG. 2 is a plot showing photoluminescent intensity against energy for a 2.2 thick GaN epilayer on (0001sapphire at 4K and room temperature.

FIG. 2 gives a plot of the observed PL spectrum for a representative layer of GaN. As shown in FIG. 2, even at very low excitation intensities the yellow luminescence band is very weak at room temperature and virtually absent at 4° K. The spectra are dominated by strong donor-bound exciton emissions at 3.48 and 3.42 eV with FWHM of 4.9 and 47 meV for temperatures of 4 K and room temperature, respectively. At 4 K only very weak emission from donor-acceptor transitions are observed, which would indicate a low density of defects and/or impurities. This is consistent with the observed high mobilities and correspondingly low compensation for these layers.

Figure 3:
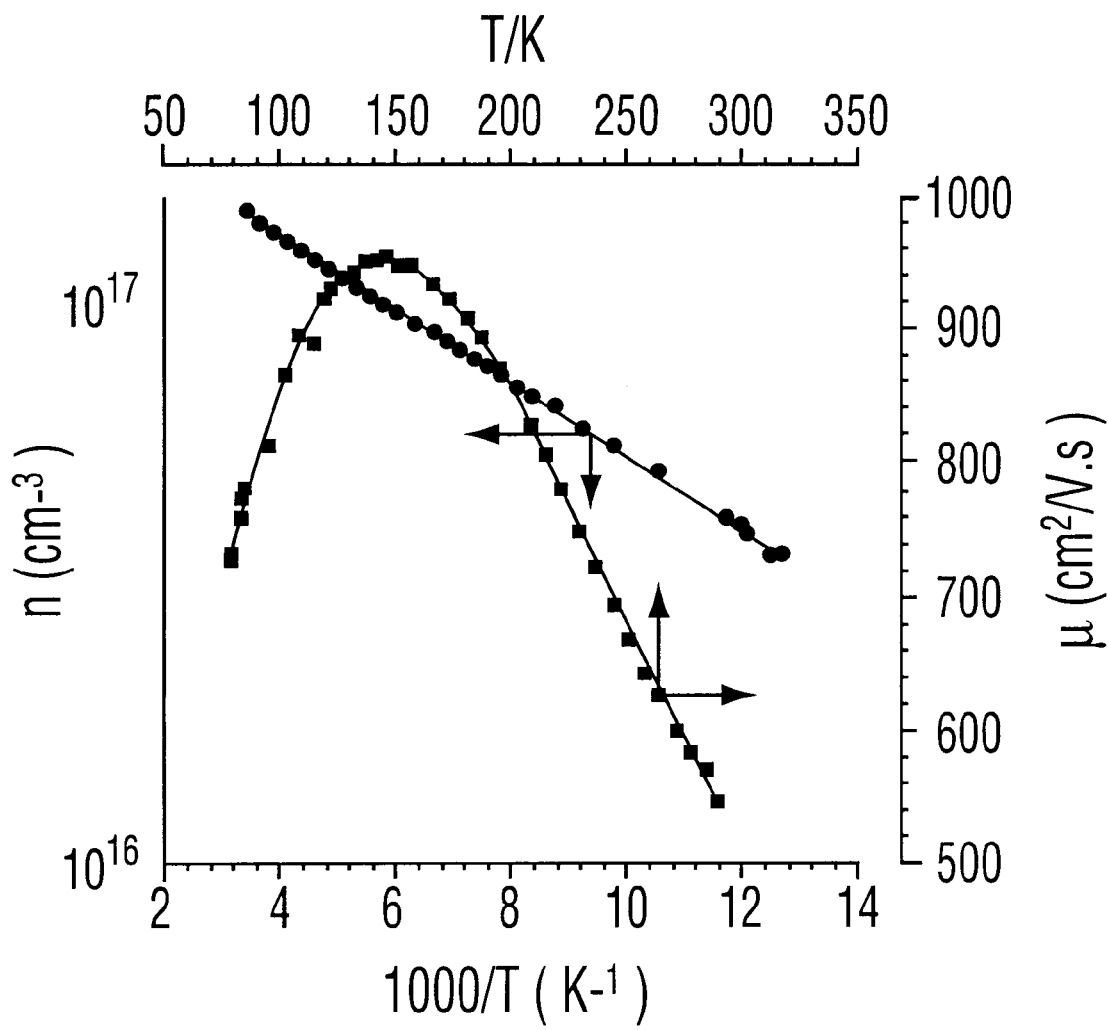
FIG. 3 shows the Hall effect carrier mobility and carrier density for a 2.3 $\mu$m thick GaN epilayer on (0001) sapphire for temperatures in the range 77 to 300° K.

FIG. 3 shows the measured mobility and carrier density of a representative GaN layer. As shown in FIG. 3, a peak mobility of 952 cm2/V s is observed at a temperature of 145 K. The corresponding carrier density shows a single activation energy of about 13 meV, which is similar to that observed previously for silicon doped GaN.

By the described technique, MBE, GaN layers with electron mobilities of up to 560 cm2/V s can be successfully grown with good reproducibility. This indicates that using the MBE technique with an MSE grown AlN buffer layer, the type of defects affecting the electron mobility can be reduced significantly as they have been using MOVPE but without the attendant disadvantages of MOVPE.

We claim:

1. A method of fabricating a gallium nitride or like epilayer on sapphire, comprising the steps of:

providing a sapphire substrate;

growing an AlN buffer layer on said sapphire substrate by magnetron sputter epitaxy (MSE) to reduce lattice mismatch; and subsequently forming said gallium nitride epilayer on said AlN buffer layer.

2. A method as claimed in claim 1, wherein said buffer layer is about 100 to 500 Å thick.

3. A method as claimed in claim 1, wherein said substrate is (0001) sapphire.

4. A method as claimed in claim 1, wherein said AlN buffer layer is deposited at a growth rate of about 0.25 μm/hr with argon and ammonia flows of about 40 and 15 sccm respectively at a deposition pressure of about 1.4 mTorr.

5. A method as claimed in claim 1, wherein said gallium nitride layer is grown by molecular beam epitaxy (MBE) on said buffer layer.

* * * * *